United States Patent [19]
Goto et al.

[11] Patent Number: 5,640,112
[45] Date of Patent: Jun. 17, 1997

[54] CLOCK SIGNAL DISTRIBUTING SYSTEM

[75] Inventors: Eiichi Goto, Fujisawa; Noriyuki Honma, Kodaira, both of Japan

[73] Assignees: Rikagaku Kenkyusho, Saitama-ken; Hitachi, Ltd., Chiyoda-ku; Fujitsu Limited, Kanagawa-ken, all of Japan; International Business Machines Corporation; NEC Corporation, Tokyo, Japan

[21] Appl. No.: 352,201

[22] Filed: Dec. 2, 1994

[30] Foreign Application Priority Data

Feb. 28, 1994 [JP] Japan .................. 6-054889
Sep. 22, 1994 [JP] Japan .................. 6-254859

[51] Int. Cl.$^6$ .................................. H03K 5/13
[52] U.S. Cl. .................. 327/141; 327/129; 327/299; 327/233; 333/100
[58] Field of Search .................. 327/141, 154, 327/155, 120, 261, 262, 292, 299, 233, 236; 326/93, 101; 333/100, 125

[56] References Cited

U.S. PATENT DOCUMENTS

| | | | |
|---|---|---|---|
| 3,267,394 | 8/1966 | Peil | 333/136 |
| 4,021,740 | 5/1977 | Homa | 327/129 |
| 4,479,216 | 10/1984 | Krambeck et al. | 327/892 |
| 5,043,596 | 8/1991 | Masuda et al. | |
| 5,184,027 | 2/1993 | Masuda et al. | |
| 5,264,746 | 11/1993 | Ohmae et al. | 327/292 |
| 5,272,390 | 12/1993 | Watson, Jr. et al. | 327/141 |
| 5,281,861 | 1/1994 | Tran et al. | 327/141 |
| 5,294,842 | 3/1994 | Iknaian et al. | 327/141 |
| 5,387,885 | 2/1995 | Chi | 327/141 |
| 5,406,118 | 4/1995 | Saito | 326/101 |
| 5,420,544 | 5/1995 | Ishibashi | 326/93 |
| 5,517,532 | 5/1996 | Reymond | 327/292 |

FOREIGN PATENT DOCUMENTS 199682  4/1989  Japan.

OTHER PUBLICATIONS

"A 100 MHz Macropipelined CISC CMOS Microprocessor" by R. Badeau et al., 1992 IEEE International Solid–State Circuit Conference, ISCC 1992 Digest of Technical Papers, pp. 104–105.

"Clocking Strategies in High Performance Processors" by M. Horowitz, 1992 Symposium on VLSI Circuits Digest of Technical Papers, pp. 50–53.

Rikagaku Kenkyujo Symposium, "Josephson Electronics", (Mar. 16, 1984); pp. 48–51.

"Quantum Flux Parametron Shift Registers Clocked by an Inductive Power Distribution Network . . . "; IEEE Trans. Applied Superconductivity, vol. 2, No. 1, (Mar. 1992); pp. 26–32.

*Primary Examiner*—Timothy P. Callahan
*Assistant Examiner*—T. Lam

[57] ABSTRACT

A clock signal distributing system supplies clock signals exhibiting extremely matched phases as a standing wave without employing extra signals such as a reference signal and the like other than clock signal itself. The system compensates for a phase lag in clock signal sand attenuation in signal amplitude. As a result, clock signals exhibiting extremely matched phases are supplied up to the places to be distributed at the respective terminals without requiring equal-length wiring on, for example, a semiconductor chip. The clock signal distributing system is composed of an electromagnetic transmission path line which transmits periodic clock signals as a standing wave, an amplifier, and a phase advancing unit which advances phases of the periodic clock signals wherein a phase lag in transmission of clock signals and a phase lag in amplitude of the amplifier are corrected in the phase advancing direction by the phase advancing unit.

18 Claims, 16 Drawing Sheets

CLOCK SIGNAL DISTRIBUTING SYSTEM

BACKGROUND OF THE INVENTION

1. Field of the Invention

The present invention relates to a clock signal distributing system which supplies clock signals at high speed in high-speed digital apparatuses, particularly high speed computers.

2. Description of the Related Art

Heretofore, in various digital systems such as a variety of computer systems ranging from mainframe computers, supercomputers and the like to small-sized computers, synchronous operation based on clock signals is carried out. In order to carry out high-speed operation in these systems, it is required to match phases of clock signals to be supplied to a flip-flop in respective integrated circuits in a system. For this purpose, a variety of configurations have been employed. FIG. 1 is a conceptual block diagram showing a conventional clock distributing system wherein reference character CG designates a clock generating circuit, DES1 designates places to which clock signals are distributed and each of them may be, dependent upon systems, a large circuit board called back board or a circuit board simply called board, or an aggregate of integrated circuit chips called module, or an integrated circuit chip in some instances, A1 denotes amplifiers or buffer circuits for receiving clock signals, DES2 denotes further lower places to which clock signals are distributed and each of them may be a circuit board, an integrated circuit module, or an integrated circuit chip, A2 designates buffer circuits for receiving clock signals, and F designates further lower places to which clock signals are distributed. In the case where DES2 is an integrated circuit chip, A2 is a buffer circuit on the chip, and F is, for example, a final flip-flop. In actuality, such a hierarchical clock signal distributing system becomes more complicated, or conversely simpler in accordance with complexity in a system. In either case, it is necessary that a phase of clock signal is within a certain allowable (in general, considerably small) range at the position in the final circuit in a digital system.

Meanwhile, in the simplest clock signal distributing system, clock signals are delivered from the clock generating circuit CG to the final circuit F in a manner like discharging of uncontrolled effluent. In this case, the phases of clock signals which reached the final circuit F are delayed by a delay time due to the path (e.g. dependent upon the length thereof) through which the signals and by another delay time which required by an amplifier or buffer circuit through which the signals passed in comparison with the clock signals which are output immediately after the CG. A length of a signal path varies considerably dependent on the place where a final circuit resides, and a delay time in a buffer circuit also varies remarkably dependent upon individual buffer circuits. (In general, while variations in a delay time of a buffer circuit are comparatively small in the same chips, if they are different chips, the variations becomes larger.) Accordingly, such manner of delivering clock signals like discharging of uncontrolled effluent as described above is unusable except for a very small and low speed system, because of significant variations in phases of the clock signals.

In this respect, for adjusting phases of clock signals, a variety of manners have heretofore been adopted. The simplest manner is such that clock signals are observed at respective places to be distributed, for example, input points of DES1 (or output points of A1) in FIG. 1, and a suitable delay means is inserted in a clock signal line path to match the phases of clock signals. Because the phase matching is manually effected in essential in this manner, the number of places to be adjusted is limited, and the precision thereof is also not good. In these circumstances, a manner for effecting automatically phase matching has been also proposed. For instance, Japanese Patent Application No. 231516/1988 discloses a clock signal distributing system wherein a signal route for signals of phase reference is provided other than a signal route for transmitting clock signals, and as a result of referring the reference signals, phases of the clock signals are adjusted. According to this system, while phase correction is automatically carried out within a range where reference signals reach, the route for reference can be wired at placed to be distributed which are positioned only at a considerably upper part in the circuit in the hierarchical clock signal distributing system of FIG. 1. More specifically, phase adjustment by means of a reference signal is extremely difficult in a comparatively small circuit board or an integrated circuit chip. Thus, it is required to adjust phases by regulating a length of wiring and the like (e.g. each length of wiring up to the place to be distributed is made equal to each other, in other words, a so-called equivalent length wiring is applied) with respect to the places to be distributed which are positioned at the lower part of the circuit than that where the route for phase reference is positioned. However, when equivalent length wiring is applied to all the places to be distributed, increase in the chip area therefor becomes remarkable so that this is disadvantage from a viewpoint of costs. Furthermore, increase in resistance of wiring on chips becomes remarkable with elevation of a degree of integration in an integrated circuit, so that variations in delay time due to CR increase. Thus, it becomes very difficult to match phases of clock signals by means of equivalent length wiring.

Moreover, a clock signal distributing system which is attained from another approach and provides clock signals having extremely low phase difference has also been proposed. Such a signal distributing system that excitation signals (clock signals) with respect to quantum flux parametron at cryogenic temperatures are supplied as standing wave on a transmission line path made of superconductor is described, for example, in RIKAGAKU KENKYUJO Symposium "Josephson Electronics" (Mar. 16, 1984), Collection of preliminary Theses, pp. 48–51; and "Quantum Flux Parametron Shift Registers Clocked by an Inductive Power Distribution Network and Errorless Operation of the QFP", IEEE Trans Applied Superconductivity, Vol. 2, No. 1, pp. 26–32, March 1992. In this case, since the transmission path is composed of a superconductor, it is not required to consider attenuation in signals due to resistance and a phase lag due to CR and the like. However, in operation at room temperature, particularly on, for example, high integrated semiconductor chips, resistance in wiring becomes very high as mentioned above, so that rotation of phase and attenuation in signals become very remarkable. Hence, this clock signal distributing system by means of standing wave is not practically used without any modification.

As described above, it is absolutely impossible to use for the adjustment of phases up to the places to be distributed at the terminals in a system, and further phase matching by means of equivalent length wiring is also impossible from physical and practical points of view.

OBJECT AND SUMMARY OF THE INVENTION

An object of the present invention is to provide a clock signal distributing system for supplying such clock signals exhibiting extremely matched phases as a standing wave without using extra signals such as a reference signal and the like other than the clock signal itself.

Furthermore, another object of the present invention is to provide also a clock signal distributing system wherein a phase lag in clock signals and attenuation in signal amplitude are compensated.

As a result, a still further object of the present invention is to supply also clock signals exhibiting extremely matched phases up to the places to be distributed at the respective terminals without requiring an equal-length wiring on, for example, a semiconductor chip.

In order to achieve the above described objects, the following means are adopted by the present invention.

First, the clock signal distributing system is composed of an electromagnetic transmission path line which transmits periodic clock signals as a standing wave, an amplifying element, and a phase advancing means which advances phases of the periodic clock signals wherein a phase lag in transmission of clock signals and a phase lag in amplitude of the amplifier are corrected in the phase advancing direction by means of the phase advancing means.

More specifically, clock signals are transmitted as a standing wave in the present invention, so that if no resistance exists on a transmission path and no delay (rotation in phase of signal) appears because of an ideal amplifying element such as buffer circuit or the like, such clock signals exhibit the quite same phases at all the places to be distributed. However, in the actual world at room temperature, there is a resistance on a transmission line, and phase of signal rotates in also a transistor. Under the circumstances, the fact to the effect that clock signals are periodic is positively utilized to advance phases of signal in the present invention. FIGS. 2(a) and 2(b) show the principle of the phase advancing means according to the present invention. In FIG. 2(a), a main cause for delay in phases, for example, that due to wiring on a printed circuit board or transistor is approximated in the simplest manner. (More specifically, transistor can be approximated by a means which is obtained by combining the phase advancing means of FIG. 2(a) with an ideal amplifier.) Assuming that a value of the resistance R1 is R, and a value of the electrostatic capacity C1 is C in FIG. 2(a), as is well-known, rotation of phase is small with respect to a comparatively lower frequency than the frequency of $2\pi$ CR, but when the frequency reaches $2\pi$ CR, the phase rotates by 45°, and when the frequency becomes higher, the phase rotates further. In the case where rectangular wave is applied as clock signals to this circuit, there occurs a delay, besides the waveform gets out of shape. In the case when sinusoidal wave is applied as clock signals to the circuit, only the phases delay, but the sinusoidal wave remains as it was (of course, it is affected by voltage amplitude). On one hand, phase can be advanced in sinusoidal wave by means of the circuit as shown in FIG. 2(b). Accordingly, when C and R each having a suitable value are used, the phases can be adjusted. According to the present invention, such phase shifting principle which utilizes periodicity of clock signals is employed.

Furthermore, according to the present invention, a phase lag is extremely reduced by using technique such as negative feedback and the like to effectively reduce C1 and R1 of FIG. 2(a).

More specifically, a phase advancing means is composed of a circuit for supplying such a current which cancels charge and discharge currents with respect to an electrostatic capacitive load of an amplifying element, and a negative feedback amplifying circuit which reduces a difference between input and output voltages in said amplifying element by means of negative feedback as a result of detecting and amplifying the difference between the input and output voltages, whereby a phase lag in the amplifier becomes extremely small. This fact corresponds to that a capacity load is effectively reduced.

Moreover, according to the present invention, in order to compensate a phase lag due to resistance in an electromagnetic transmission path, a negative resistance circuit for affording an equivalent negative resistance to the transmission path is connected thereto as a means for advancing phases. This arrangement corresponds to that the resistance is effectively reduced.

Furthermore, according to the present invention, in order that a standing wave is capable of existing over a wide range of wiring length, a circuit for adding equivalent negative electrostatic capacity is connected across an electromagnetic transmission line and a grounding body thereby accelerating phase velocity of clock signals on the path line to lengthen wavelength of the clock signals. In addition, regarding this structure, a protective conductor is disposed between the electromagnetic transmission path line and the grounding body, and output of an amplifier which constitutes a part of the equivalent negative electrostatic capacity circuit is connected to the protective conductor, whereby a wavelength of clock signals is lengthened. This structure corresponds also to that C is effectively reduced.

Furthermore, the present invention may be constituted such that one or a plurality of filter circuit(s) is (are) connected to a part of an electromagnetic transmission path line and/or a part of a protective conductor, and a length of the electromagnetic transmission path line is arranged so as to attenuate oscillation of a frequency corresponding to ¼ wavelength or more.

Moreover, the present invention may be constituted such that two transmission systems for positive phase clock signals and negative phase clock signals are prepared as each clock signal transmission system composed of an electromagnetic transmission path line, a protective conductor and an amplifier, the amplifier is an inverter the output of which becomes an opposite phase to that of the input, the input of said amplifier for the positive phase is connected to said electromagnetic transmission path line for the negative phase, while the output of said amplifier is connected to said protective conductor for the positive phase, respectively, and the input of said amplifier for the negative phase is connected to said electromagnetic transmission path line for the positive phase, while the output of said amplifier is connected to said protective conductor for the negative phase, respectively.

According to the structures of the present invention as mentioned above, clock signals can be supplied to the whole digital system as a standing wave, so that such clock signals exhibiting extremely matched phases can be supplied up to the places at the terminals of the system to which the clock signals are distributed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2(a) and 2(b) are circuit diagrams showing the simplest circuits one of which shows a cause for phase lag in signals and the other shows a circuit for phase advancement wherein FIG. 2(a) is a circuit diagram showing a cause for phase lag, and FIG. 2(b) is a circuit diagram showing a circuit for effecting phase advancement;

FIGS. 8(a), 8(b) and 8(c) are views showing various examples of an electromagnetic transmission path line wherein FIG. 8(a) shows a transmission line having the simplest structure, FIG. 8(b) is a sectional view showing a transmission line having another structure, and FIG. 8(c) is a sectional view showing a transmission line having a more complicated structure;

FIG. 17(a) and 17(b) are explanatory diagrams concerning a simulation of signal delay in the circuit of an example obtained by combining the embodiments according to the present invention with each other wherein FIG. 17(a) is a graphical representation showing results of the simulation, and FIG. 17(b) is a circuit diagram showing the circuit used in the simulation.

DETAILED DESCRIPTION OF THE PREFERRED EMBODIMENTS

Embodiments of the present invention will be described in detail hereinbelow in conjunction with the accompanying drawings.

Figure 3:
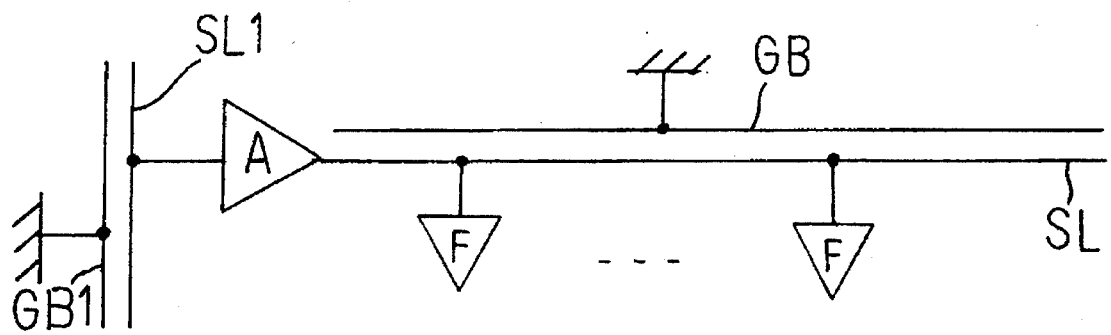
FIG. 3 is a diagram showing the essential structure of an embodiment according to the present invention.

FIG. 3 shows the furthermost end part of an embodiment according to the clock signal distributing system of the present invention wherein reference characters SL and SL1 designate electromagnetic transmission paths for transmitting clock signals, respectively, and each far end is an open end, reference character A designates an amplifying circuit provided with a phase advancing means, and F designates a means for receiving supply of clock signals, for example, a flip-flop. In order to clearly indicate that SL and SL1 are transmission paths, grounding bodies GB and GB1 are shown in parallel to SL and SL1, respectively. When the present technology is utilized, it is usual to contain all the parts in FIG. 3 on the same chip. Accordingly, in such a case, the transmission path lines L and SL1 are composed of a wiring (strip lines) on the chip. Clock signals transmitted on the SL and SL1 path are sinusoidal so that the wave transmits on the transmission paths as a standing wave. In the case of feeding clock signals on a chip, it is intended to feed at any suitable position on the transmission path lines, so that appearance of the any node of standing wave on the transmission path lines is not desired. For this reason, a length of the transmission path is as short as possible, but it is practically, for example, $\lambda/8$ ($\lambda$:wavelength) or less. (In a vacuum, $\lambda/8=37.5$ mm with respect to frequency 1 GHz, and 3.75 mm with respect to 10 GHz. On silicon, values become ½–⅓ of the former values). In this case, amplitude of the clock signal on a transmission path line by $\cos(2\pi/8)=1/\sqrt{2}$ at the most. However, phase is the same at any place on the transmission path line as a characteristic feature of standing wave. It is to be noted that another similar system for feeding clock signals is required in the case where clock signals are fed as differential signals, but it is sufficient to duplicate the same system.

Figure 4:
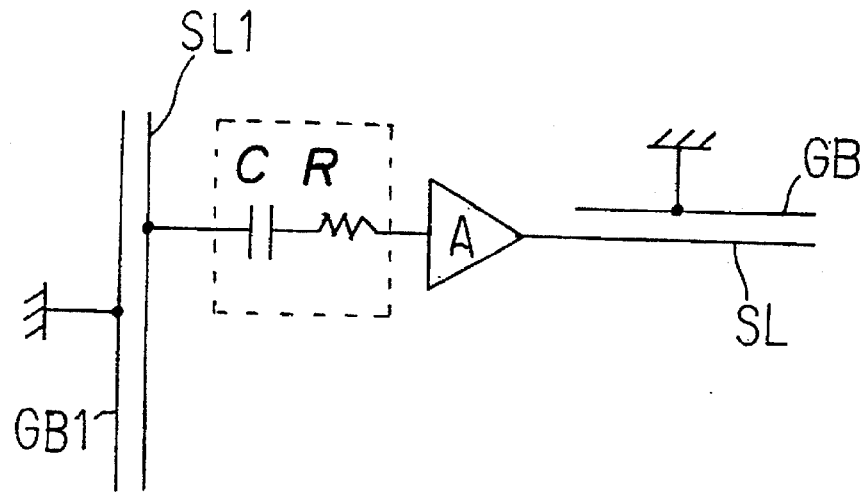
FIG. 4 is a diagram showing an embodiment of an amplifying circuit provided with the phase advancing circuit according to the present invention.

FIG. 4 shows the simplest example for constituting the amplifying circuit of FIG. 3 by combining a phase advancing circuit composed of a capacitor C and a resistance R with an amplifying circuit A wherein a phase lag of the amplifier is compensated by the use of the phase advancing circuit. In this phase advancing circuit, however, advancement of phase is dependent upon frequency, besides a phase lag of amplifier varies also dependent on chips, so that precise compensation is difficult. It is to be noted that in the case of amplifying sinusoidal wave, since it is not required that the input level of an amplifier coincide with the output level thereof, capacitive coupling may be suitably used for coupling of stages.

Figure 5:
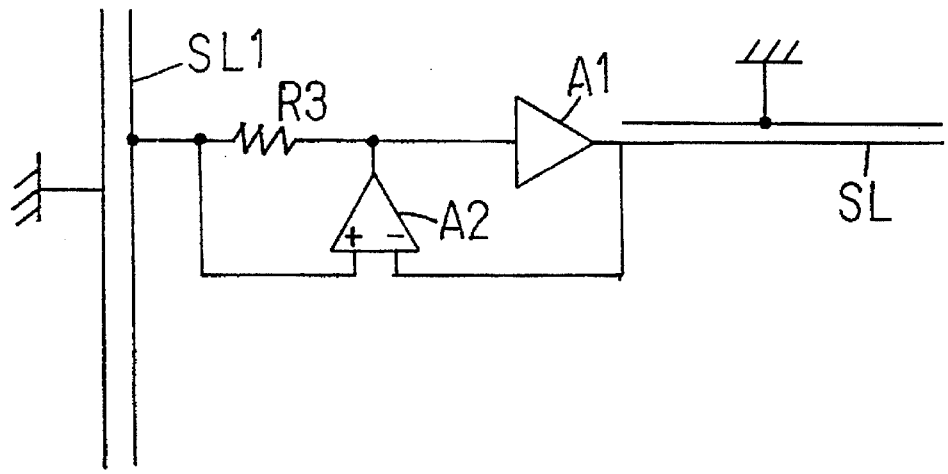
FIG. 5 is a diagram showing the principle of an embodiment of the amplifying circuit (buffer circuit) according to the present invention provided with a phase advancing circuit which compensates a phase lag by means of negative feedback.

FIG. 5 shows an embodiment wherein phase compensation is realized by negative feedback in place of the capacitor C and the resistance R. In FIG. 5, reference character R3 designates a resistance for applying negative feedback, A1 an amplifying circuit (buffer circuit), and A2 a differential amplifier, respectively. When the phase of the output from the buffer circuit lags as compared with that of the signal on the transmission path line SL1, a signal for advancing the phase is produced from the output of the amplifier A2 to correct the phase. Any type of device may be used for the buffer circuit and the differential amplifier used in the present embodiment. As mentioned above, since a sinusoidal wave is utilized as the clock signals, capacitive coupling may suitably be used for coupling of stages. Accordingly, voltage levels of input and output in these buffer circuit and differential amplifier are arbitrary.

Figure 6:
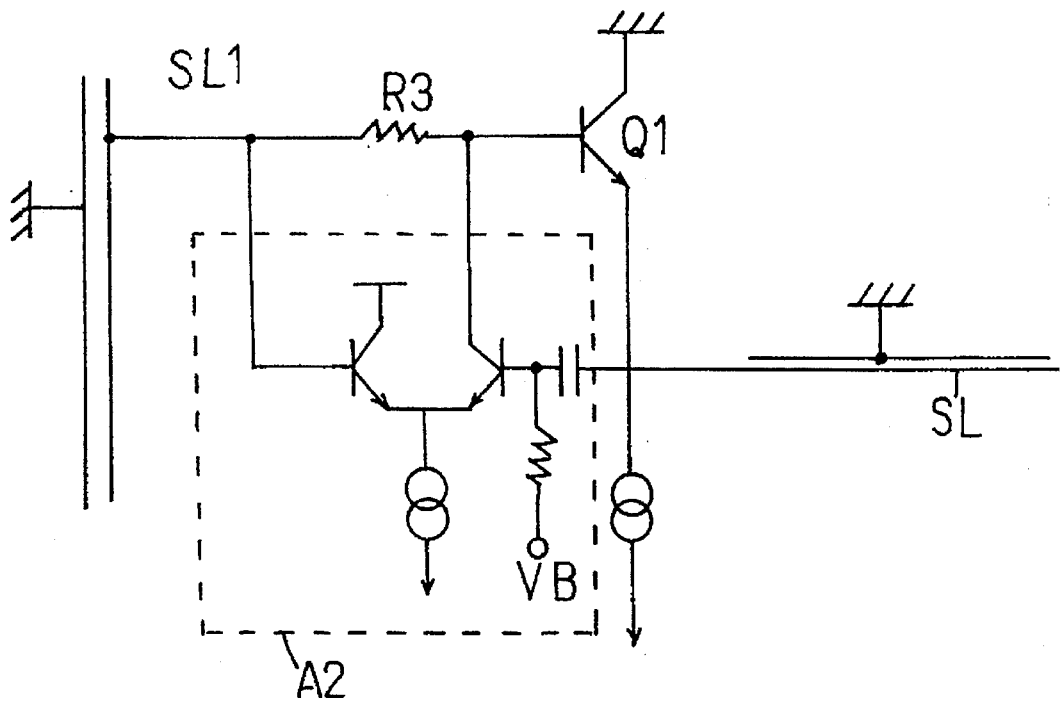
FIG. 6 is a diagram showing an embodiment according to the present invention by which the amplifying circuit of FIG. 5 is realized.

FIG. 6 shows an embodiment which is composed of an emitter follower and the most popular transistor pair replaced by the buffer circuit and the differential amplifier of FIG. 5, respectively, wherein reference character VB designates a suitable bias voltage. In this embodiment, while capacitive coupling is effected with respect to output of the emitter follower, on the contrary C-coupling may be, of course, made with respect to input of the left-hand transistor. Furthermore, although there is a discrepancy of potential $1V_{BE}$ between the transmission lines SL1 and SL, capacitive coupling may suitably be used if it is required to unify the potential. In addition, while the transmission line SL is shown as a transmission line, of course, the same effect can be obtained if it is a capacity of concentrated constant in some cases.

In the above embodiments, while an example in which bipolar transistor is used for the transistor has been described, of course, FET such as MOS transistor, GaAs and the like may also be used. Furthermore, as a matter of course, the same structure as that described above can be attained even if amplifying elements other than semiconductor are used. In this respect, while the description will be made in also the following embodiments by using bipolar transistor, the same circuit can be, of course, constituted even if the other suitable amplifying elements are used.

Figure 7:
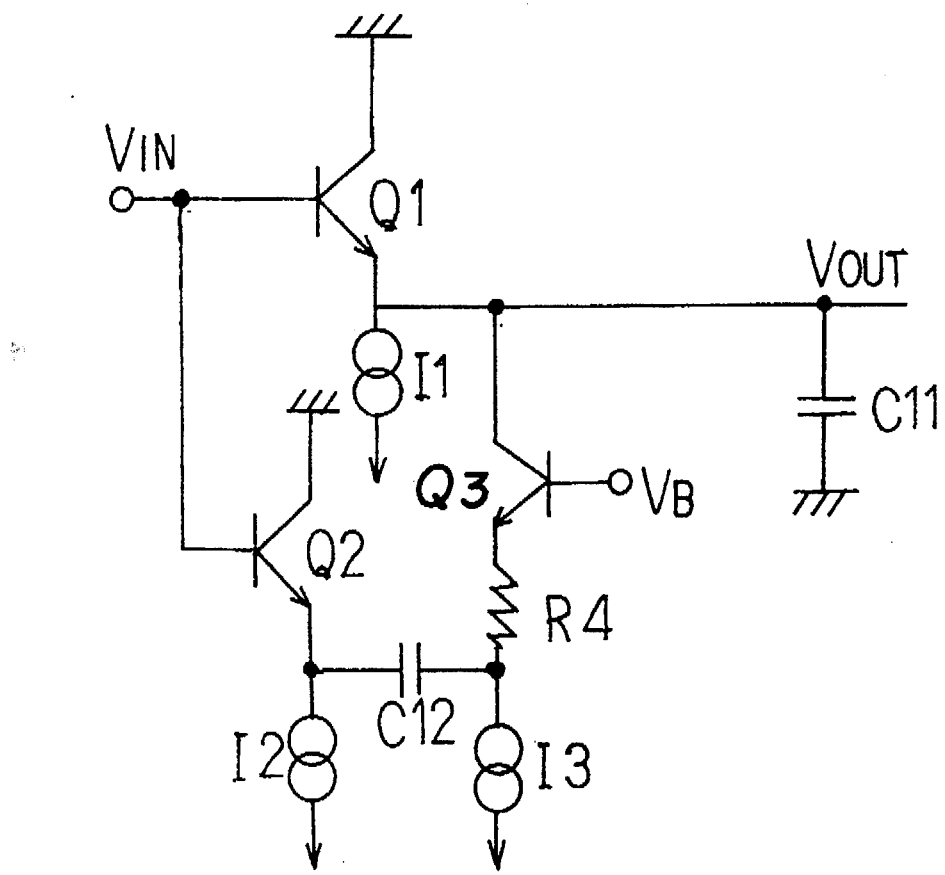
FIG. 7 is a diagram showing an embodiment of the amplifying (buffer) circuit according to the present invention provided with a negative electrostatic capacity circuit which flows a current for canceling charge and discharge currents of a capacity load.

FIG. 7 shows an embodiment of a circuit for canceling charge and discharge currents with respect to a capacity load C11 wherein reference characters Q1 and I1 designate an emitter follower and a current source, respectively, which compose a buffer circuit. Reference character C11 designates a loaded capacity (distributed or concentrated capacity). The charge and discharge currents canceling circuit is composed of Q2, Q3, I2, I3 and C12. Now, supposing that an input voltage $V_{IN}$ changes in the positive direction, in this case an output $V_{OUT}$ changes also in the positive direction, whereby charge current flows in the load C11. As is well-known, a transient current flowing from the transistor Q1 is determined by $f_T$ of the transistor, so that the response becomes slower with an increase in the transient current, and thus rotation in phases of signal becomes higher. Reference character Q3 designates a common base transistor to the base of which is applied a constant bias voltage $V_B$ so that a constant current flows therein, provided that no signal is applied thereto. When the input voltage $V_{IN}$ changes into positive, the emitter follower Q2 responds thereto, whereby a charge current flows into C12. The current flowing through Q3 decreases by an amount corresponding to that of this charge current so that after all, the current flowing through Q1 decreases by an amount of the charge current in C12. As a result, a current increment due to the charge current in C11 decreases by that amount. While a value in C12 may be determined arbitrarily by the requirement for its design, the most effective is that the value of C12 is made to be the same with that of C11. Fortunately since variations in ratio of electrostatic capacity are slight in the same chip, it is easy to reduce relative variations between C11 and C12. It is to be noted that while the circuit in this embodiment may be, of course, used alone, the effect thereof becomes extremely high, when used in combination thereof with another phase advancing circuit, for example, the circuit of FIG. 6. Furthermore, an emitter resistance R4 with respect to Q3 is for broadening a voltage range in which this circuit is operatable as negative electrostatic capacity, so that the emitter resistance may be removed if it is not required. Moreover, this circuit may be used as a negative electrostatic capacity circuit by modifying slightly the connection thereof, and an embodiment therefor will be described hereinbelow.

Figure 8A:
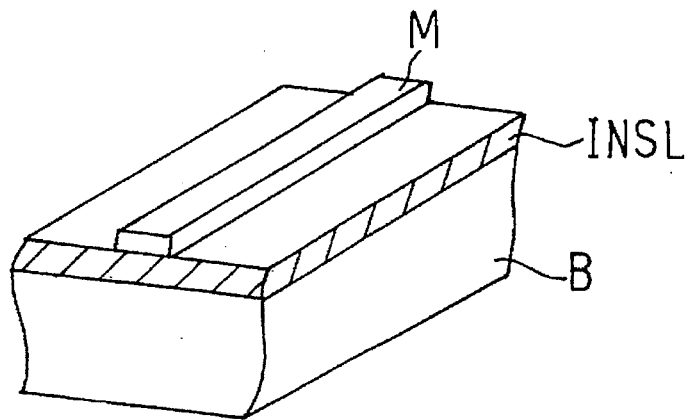
Figure 8B:
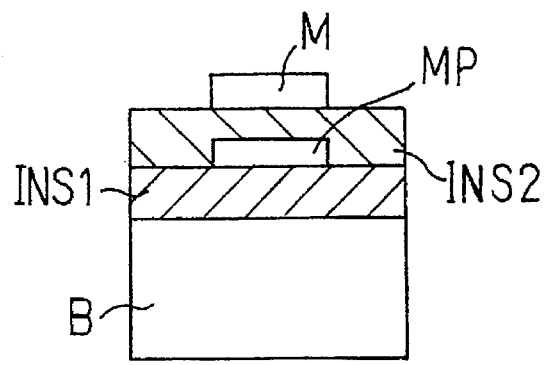
Figure 8C:
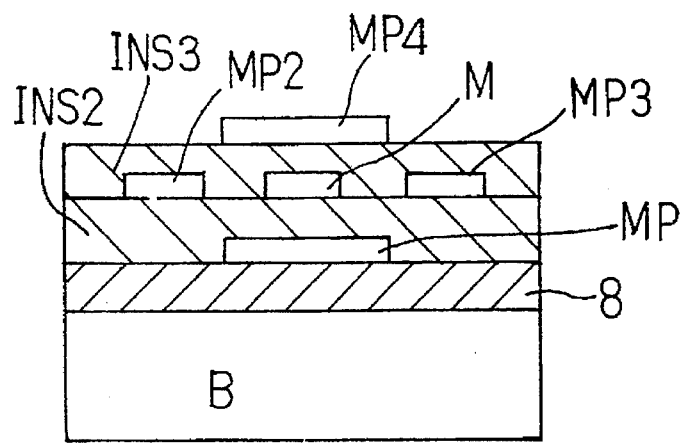

Prior to the descriptions for the other embodiments, electromagnetic transmission line and standing wave will be more specifically explained. An example of the transmission line on a semiconductor chip will be described herein as a transmission line. Some examples of transmission line being capable of realizing the same on a chip are shown in FIG. 8 in which (a) shows a transmission line having the simplest structure wherein reference character M designates a conductor, INS1 an insulator, B a silicon substrate, respectively. A strip line having the above structure uses a silicon substrate which is in an alternating current earth voltage state as a retrace line conductor for signal. FIG. 8(b) is a sectional view showing a transmission line having another structure in which an intermediate conductor MP being used also for a retrace line other than the conductor M for signal is particularly disposed. Accordingly, the intermediate retrace line conductor may be maintained at an arbitrary voltage other than earth potential, so that it may be used as a protective conductor as described in the undermentioned embodiments. Reference character INS2 designates an insulator, INS1 and B designate an insulator and a silicon substrate, respectively. When referred the same members in the other figures with that in FIG. 8(a), the same reference characters as those of FIG. 8(a) are used in the other figures. FIG. 8(c) is a sectional view showing a transmission line having a more complicated structure wherein the perimeter of a conductor for signal M is surrounded by intermediate conductors MP1, MP2, MP3 and MP4 (an example including no conductor MP4 is also possible). Each intermediate conductor is maintained at the same potential by means of, for example, a via-hole. Since FIGS. 8(a) through (c) show very few examples of transmission line, they may have an intermediate and arbitrary structure shown in from FIGS. 8(a) to (b), besides size of the intermediate conductors shown in FIGS. 8(b) and (c) may be modified from the original structures shown therein as occasion demands.

Figure 9A:
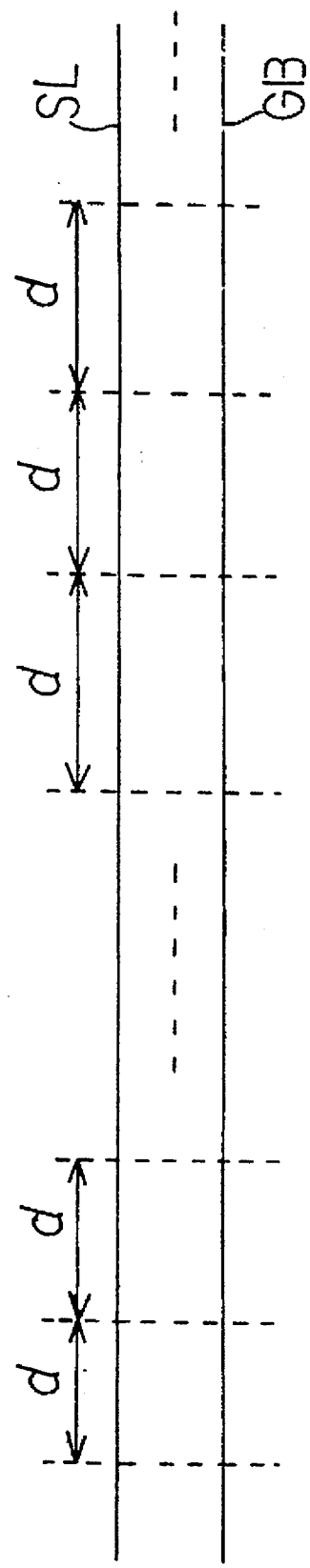
FIG. 9(a) and 9(b) are diagrams for explaining concentrated constant approximation in electromagnetic transmission path.
Figure 9B:
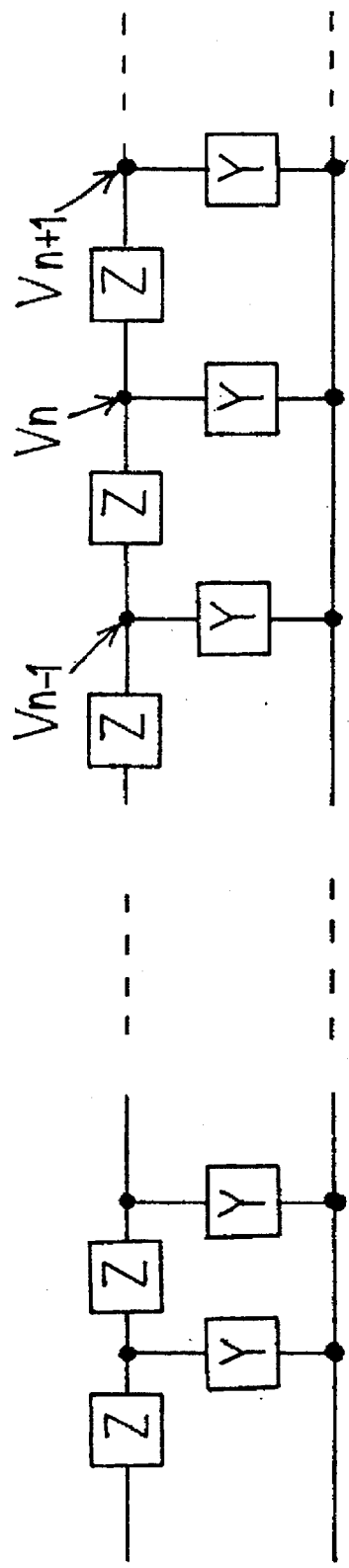

FIG. 9 is a diagram for explaining the characteristic features of the transmission line as described above (or a more perfect transmission line, for example, the one like a coaxial line) wherein first, a transmission line composed of a conductor for signal SL and a conductor for retrace line (grounding body) GB is divided into small sections each having a length d to be represented by concentrated constant (FIG. 9(a)). The length d is small as compared with wavelength λ, it is, for example, (⅒)λ or less. (Accordingly, as mentioned above, the length d becomes about 10 mm or less with respect to frequency 1 GHz, and about 1 mm or less with respect to 10 GHz.) In this case, when impedance and admittance are expressed by Z and Y, respectively, the transmission line is shown by FIG. 9(b) as is well-known. When node voltages in the (n−1)-, n- and (n+1)-stages are expressed by $V_{n-1}$, $V_n$ and $V_{n-1}$, respectively, and Kirchhoff's law is applied to the node voltage in the n-stage, $$(V_{n-1}-V_n)/Z+(V_{n+1}-V_n)/Z=V_n \cdot Y$$

is obtained.

Accordingly, when propagation constant $\lambda$ is defined by:

$$\gamma \equiv V_n/V_0,$$

$$\gamma^2-(2+YZ)\gamma+1=0$$

$$\therefore \gamma=1+(YZ/2)\pm\sqrt{(YZ(1+YZ/4))}$$

is obtained.

When inductance and capacitance per a section (length d) of the transmission line are expressed by L and C, respectively, $Z=j\omega L$, and $Y=j\omega C$. Accordingly, $$YZ=-\omega^2 LC$$

$$\therefore \gamma=1-\omega^2 LC/2\pm\sqrt{(-\omega^2 LC(1-\omega^2 LC/4))}$$

where magnitude of YZ is proportional to substantially $1/\lambda^2$. That is, $YZ=-\omega^2 LC$ #—$(1/\lambda^2)$ (In the present specification, "#" is a symbol representing proportional relationship.)

When two solutions of $\gamma$ are expressed by $\gamma+$ and $\gamma-$, the voltage $V_n$ is represented by the following equation.

$$V_n = \gamma+^n \cdot V_{0+} \gamma-^n \cdot V_{0-}$$

In case of $V_{0+}=\pm V_{0-}$, it is standing wave.

Figure 10A:
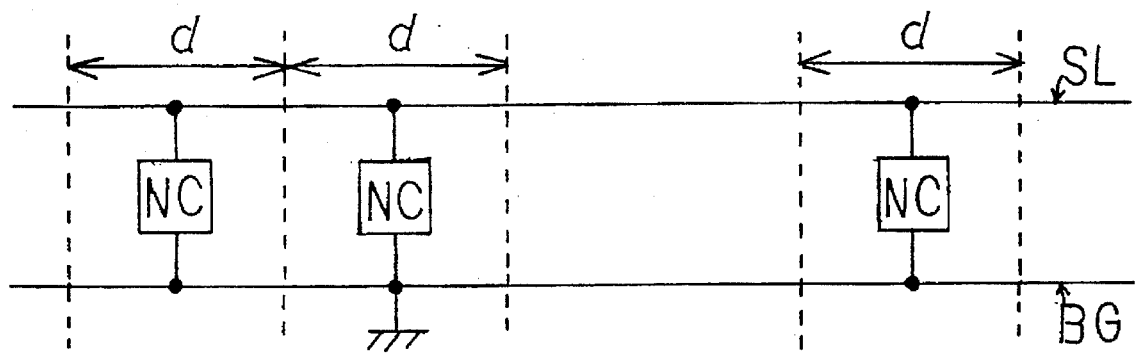
FIGS. 10(a) and 10(b) are diagrams each showing an embodiment according to the present invention in which a negative electrostatic capacity circuit is connected to an electromagnetic transmission path to lengthen a wavelength of clock signals.
Figure 10B:
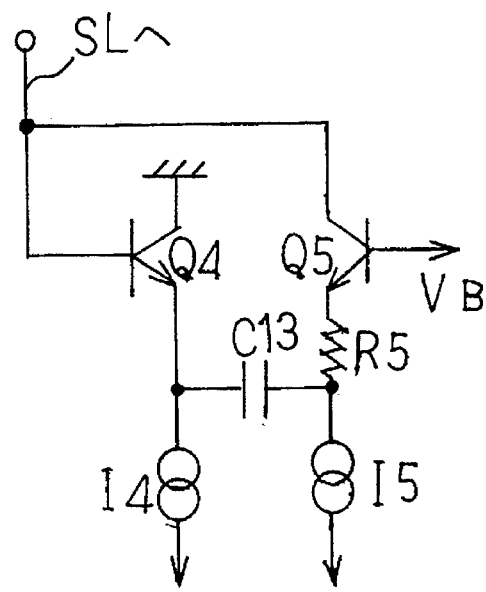

FIG. 10 shows an embodiment of the present invention. In FIG. 10(a), reference character SL designates a conductor for signal, GB a grounding body, and NC a negative electrostatic capacity circuit, respectively. FIG. 10(b) shows an example of the negative electrostatic capacity circuit wherein function of the negative electrostatic capacity circuit is the same as that of the circuit of FIG. 7. Accordingly, when potential of the conductor SL increases, charge current flows in order to charge the electrostatic capacity between the conductor SL and the grounding body GB. However, when a base voltage of Q4 increases, the current flowing through Q5 decreases to just cancel the charge current. On the contrary, when the voltage of SL decreases, the adverse action appears to cancel the discharge current. This is the function of negative electrostatic capacity circuit, so that electrostatic capacity of electromagnetic transmission path decreases equivalently. Thus, as mentioned above, it becomes substantially:

$$YZ=-\omega^2 LC \text{ \#—}(1/\lambda^2).$$

accordingly, $\lambda$ increases in response to equivalent decrease of C. (This fact means that phase velocity of signal propagation becomes fast in proportion to substantially $\sqrt{LC}$.) In this case, it is to be noted that the resistance R5 is for broadening range of action as in the case of FIG. 7, so that the resistance R5 may be removed, it is not necessary.

It is assumed that equivalent wavelength $\lambda$ was made, for example, ten times longer by utilizing the effect obtained by the present invention, a line length of about 1 mm becomes to correspond only to a length of about $(1/100)\lambda$, so that it becomes possible to obtain close characteristics to that of perfect distribution constant circuit by means of a concentrated constant approximate circuit into which is inserted a negative electrostatic capacity circuit at a position of a line length of about $(1/10)\lambda$. Conversely, it becomes also possible to make a line length in one section much longer. While a plurality of negative electrostatic capacity circuits are connected to the transmission path in FIG. 10(a), of course, it may be a single negative electrostatic capacity circuit dependent upon a length of transmission path.

Figure 11:
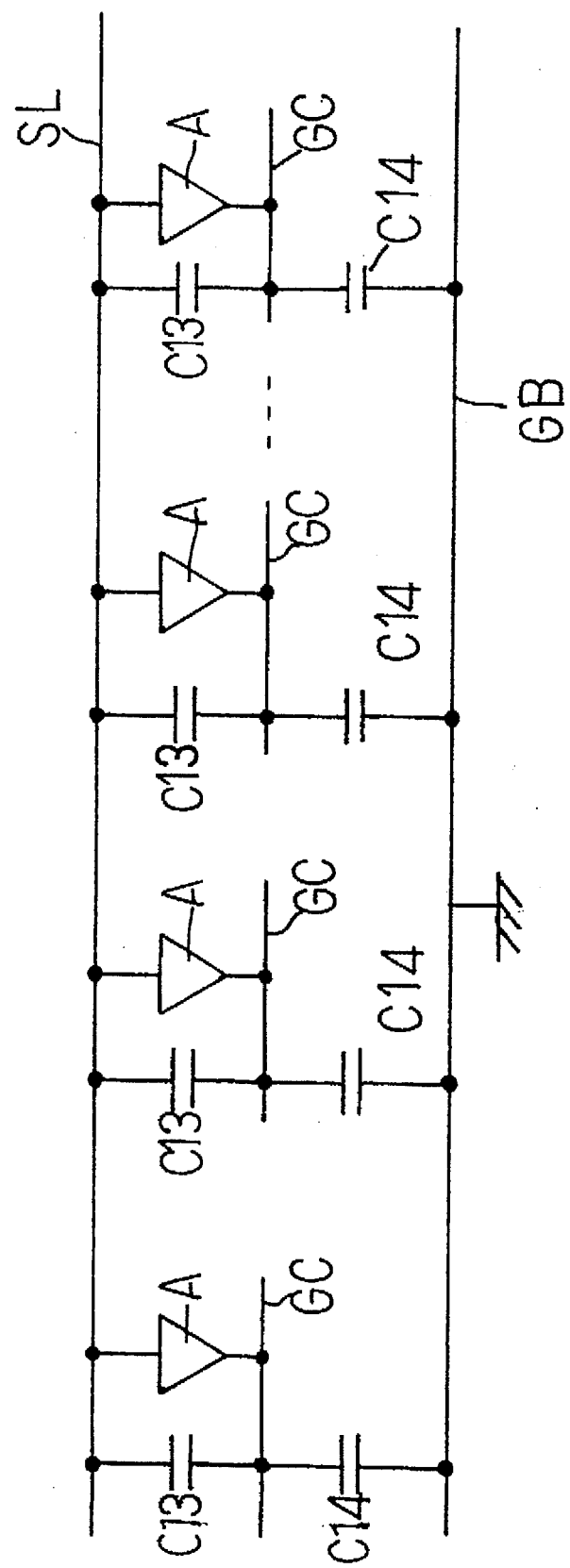
FIG. 11 is a diagram showing an embodiment according to the present invention containing protective conductors to which are applied clock signals through buffers, whereby a negative electrostatic capacity circuit is constituted to lengthen a wavelength of the clock signals.

FIG. 11 is another embodiment of the present invention wherein reference character SL designates a signal conductor for GB designates a grounding body, and each GC designates a protective conductor like MP in FIG. 8(b) or MP1-MP4 in FIG. 8(c). By this protective conductor, the signal conductor is shielded from the grounding body. Accordingly, the transmission line composed of the impedance Z and the admittance Y in FIG. 9 is constituted from the conductor for signal and the protective conductors in the present embodiment. (In FIG. 11, C (corresponding to Y) required for the following explanation is shown, but Z is omitted.) In this figure, the protective conductor is divided into a plurality of protective conductors wherein reference character A designates an amplifier for maintaining potential of the protective conductor GC at substantially the same potential with that of the conductor for signal and which is obtained from either any one of the amplifiers shown in FIGS. 5–7 or the combination thereof. Accordingly, to the protective conductor GC is applied a signal having substantially the same phase and amplitude as those of the signal on the conductor for signal SL. Assuming that the signal on the conductor SL is expressed by V, and a signal:

$$(1-g)V(|g|\leq 1)$$

is applied to the protective conductor GC, a value of C13 between the conductor SL and the protective conductor GC is C, and it becomes effectively:

$$C \to gC.$$

Thus, it becomes effectively:

$$YZ \to gYZ \; \lambda \to \lambda/g$$

and the wavelength $\lambda$ comes to be long as in the case of FIG. 10. In this case, the nearer g to 0 brings about the longer wavelength. In this embodiment, while the amplifying circuit A charges and discharges an electrostatic capacity C14 between the protective conductor GC and the grounding body GB, if g=0 is perfectly established, there is no potential change between the conductor for signal and the protective conductor. Accordingly, C13 positioned between both the conductors is never charged and discharged (effectively C=0) so that the wavelength $\lambda$ becomes infinity. Furthermore, although the protective conductor is shown in FIG. 10 as a plurality of divided ones, it is, of course, not required to divide the same, when a transmission line path is short. A length of the protective conductor may be in such that a phase of the signal on the conductor for signal and the protective conductor is within a required design value. Consequently, such length is different dependent upon a structure of transmission path, an allowable value in the phase difference and the like.

Meanwhile, in an actual transmission path used at room temperature, series resistance exists inevitably. In this respect, as mentioned above, the series resistance in wiring is not neglected in a recent integrated circuit chip the microminiaturization of which has been considerably improved. That is, one of the significant reasons for limiting length of an electromagnetic transmission path in which standing wave can exist is this resistance. In FIG. 9, although a transmission path containing no resistance was described, herein when a resistance in each section of the conductor for signal is expressed by r, impedance Z per section is as follows.

$$Z=j\omega L+r$$

Thus, when a resistance R is connected in parallel to C, an admittance Y becomes:

$$Y = j\omega C + 1/R.$$

Accordingly, $$YZ = -\omega^2 LC + r/R + j\omega (L/R + Cr).$$

That is, when the equation:

$$R = -L/Cr$$

can be made negative, the imaginary number item of YZ becomes 0 so that the effect of a phase lag due to r can be canceled.

Figure 12A:
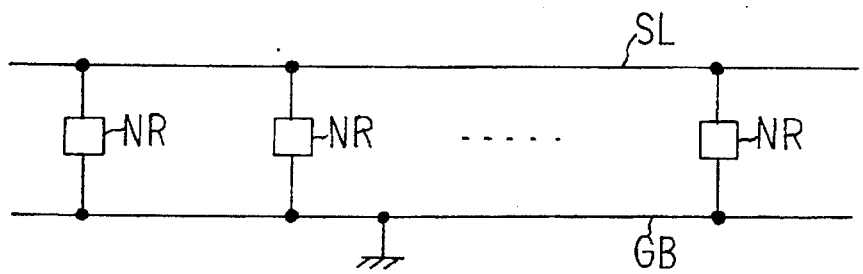
FIGS. 12(a), 12(b) and 12(c) are diagrams each showing an embodiment according to the present invention wherein a phase lag due to a series resistance of the signal line in an electromagnetic transmission path is compensated by means of negative resistance circuits.
Figure 12B:
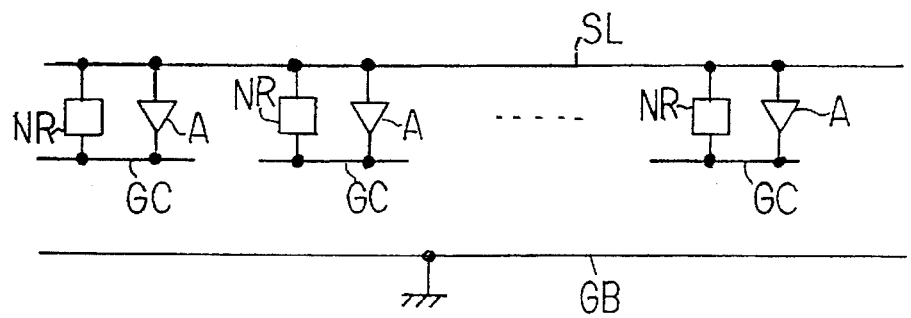
Figure 12C:
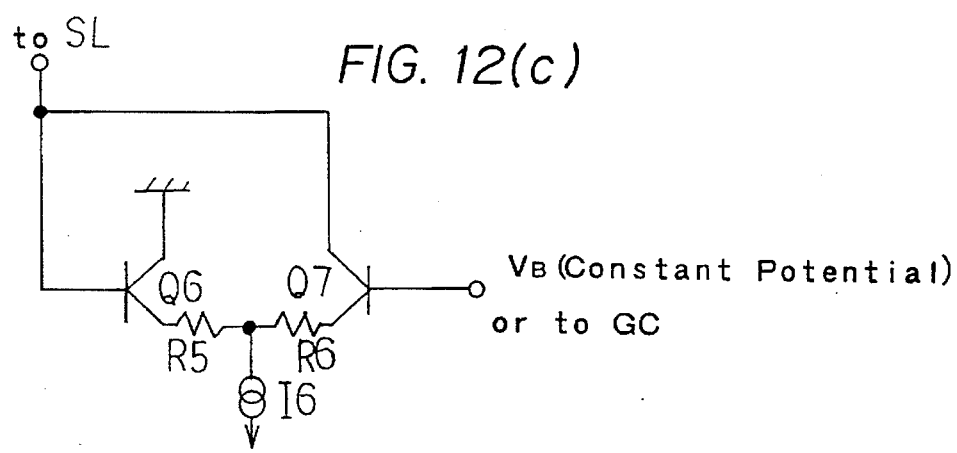

FIGS. 12(a)–12(c) show an embodiment in which such negative resistance circuit as described above is used. FIG. 12(a) shows an embodiment wherein a negative resistance circuit NR is connected across a conductor for signal SL and a grounding body GB, and an embodiment of the negative resistance circuit is shown in FIG. 12(c). When the circuit of FIG. 12(c) is used in the embodiment of FIG. 12(a), the base of a transistor Q7 is connected to a constant potential $V_B$. As the potential $V_B$, either the central potential of sinusoidal wave on the conductor for signal or a different potential therefrom may be used dependent upon its design. The base of a transistor Q6 and the collector of the transistor Q7 are connected to the conductor for signal SL. Accordingly, when a signal V on SL changes in positive direction, a current I flowing into the transistor Q7 decreases. This fact means that this circuit is just equivalently a negative resistance. A value of the negative resistance in this circuit is represented as follows.

$$R = (dV/dI) = -(kT)/(qI)$$

where
  K: Boltzman's constant
  T: temperature
  Q: quantity of electric charge Thus, when the current I6 of a current source and $V_B$ are suitably designed, the negative resistance having a desired value can be obtained. In order to broaden a voltage range within which such negative resistance can be obtained, it is sufficient to connect resistances R5 and R6 as indicated by the dotted line to the emitter of a transistor. A value of the negative resistance in that case is such that the absolute value increases only by the value of these resistances.

Fig. 12(b) shows an embodiment in which an electromagnetic transmission line is provided with protective conductors, and an amplifier A for negative electrostatic capacity and a negative resistance circuit NR are connected across a conductor for signal SL and each protective conductor GC. Since functions of individual circuits in the present embodiment have already been described as to the respective circuits, the detailed description therefor will be omitted.

Figure 13A:
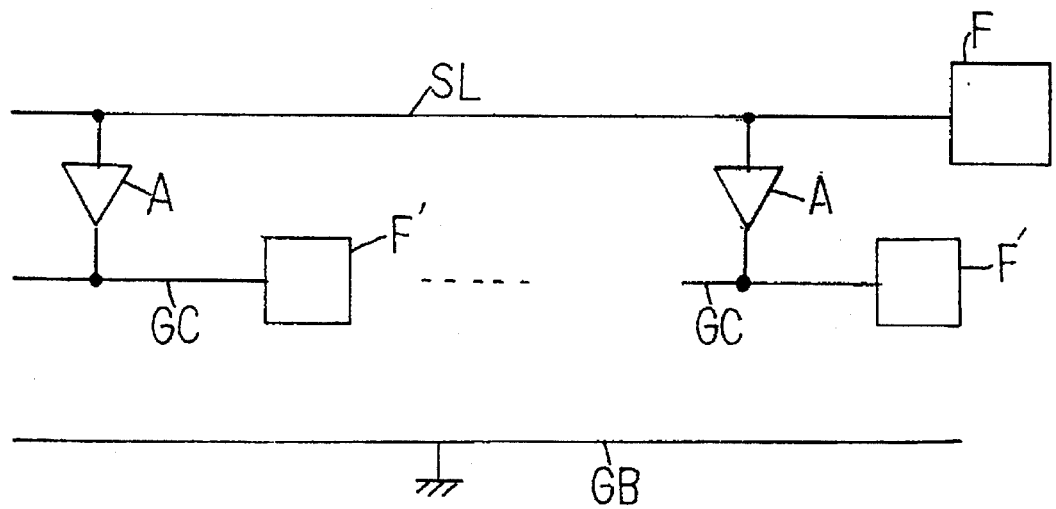
FIGS. 13(a), 13(b), 13(c) and 13(d) are diagrams each showing an embodiment according to the present invention which includes an additional circuit for suppressing unnecessary oscillation.
Figure 13B:
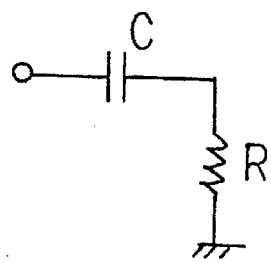
Figure 13C:
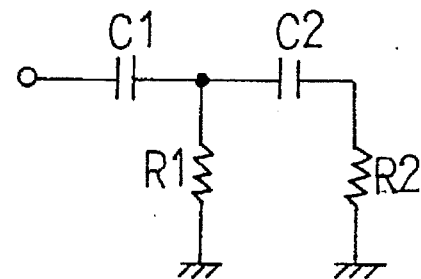
Figure 13D:
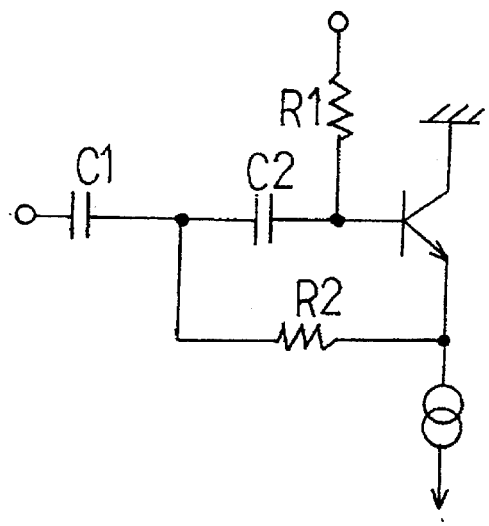

FIGS. 13(a)–13(c) show another embodiment of the present invention wherein the circuit of FIG. 13(a) is that obtained by adding further circuit(s) F and/or F' to the invention of, for example, FIG. 11 (in which the inductance L and the capacity C were omitted for simplification of the drawing). As is well-known, when a signal of ¼ wavelength is applied to a transmission line an end portion of which is opened or short-circuited, resonance arises. In the present invention, while only a transmission line having such a length which reaches only up to about ⅛ wavelength in frequency of clock signal is handled (for example, 20 mm or less in the case of 1 GHz, and 4 mm or less in the case of 5 GHz), there is such a possibility that oscillation of ¼ wavelength (oscillation of two times higher frequency than that of clock signal in the case when a length of transmission line is ⅛ wavelength with respect to a frequency of the clock signal) rides on the clock signal in the case where a number of transmission lines according to the present invention each having the same length in the same chip exist. The circuits F and F' are the ones for removing this ¼ oscillation, and an embodiment of which is shown in FIGS. 13(b)–(d). FIG. 13(b) shows a high-pass filtering circuit (filter composed of a resistance R and a capacity C in which the transmission line is opened in low frequency, while the transmission line is terminated with the resistance R in high frequency. Accordingly, when time constant is selected so as to have such characteristic that oscillation of ¼ wavelength passes through such transmission line, but the necessary clock signal does not pass through the same, there is no fear as described above. FIG. 13(c) shows a high-pass filter in which R and C are formed in two states, and which is superior to the circuit of FIG. 13(b) in cutoff characteristics. FIG. 13(d) shows an example of filter in which active inductance employing a transistor is utilized wherein R and C are selected in such that impedance decreases with respect to a signal of ¼ wavelength. The filters described above are shown as examples and in this connection, any type of circuits which can suppress oscillation of ¼ wavelength may be used. Furthermore, although filters have been connected at two positions F and F', it is sufficient, of course, to use one of them, if the filter used can suppress oscillation of ¼ wavelength. Moreover, such a filter can also be inserted into any position of conductors for signal or protective conductors. In the case where, for example, a high-pass filter is used in such a system that signal conductors having a variety of lengths, respectively, are employed, it is sufficient to use a filter having characteristic suppressing such a frequency in which the length of the longest signal conductor corresponds to ¼ wavelength. This is because such a frequency which becomes ¼ wavelength with respect to a shorter conductor for signal is, as a matter of course, higher frequency than that of a longer conductor for signal in ¼ wavelength. In addition, when a high-pass filter is used, any of such frequency being higher than that corresponding to ¼ wavelength is attenuated. Accordingly, even if there is a cause for producing oscillation at the higher frequency, it is possible to also attenuate also such oscillation.

Figure 14:
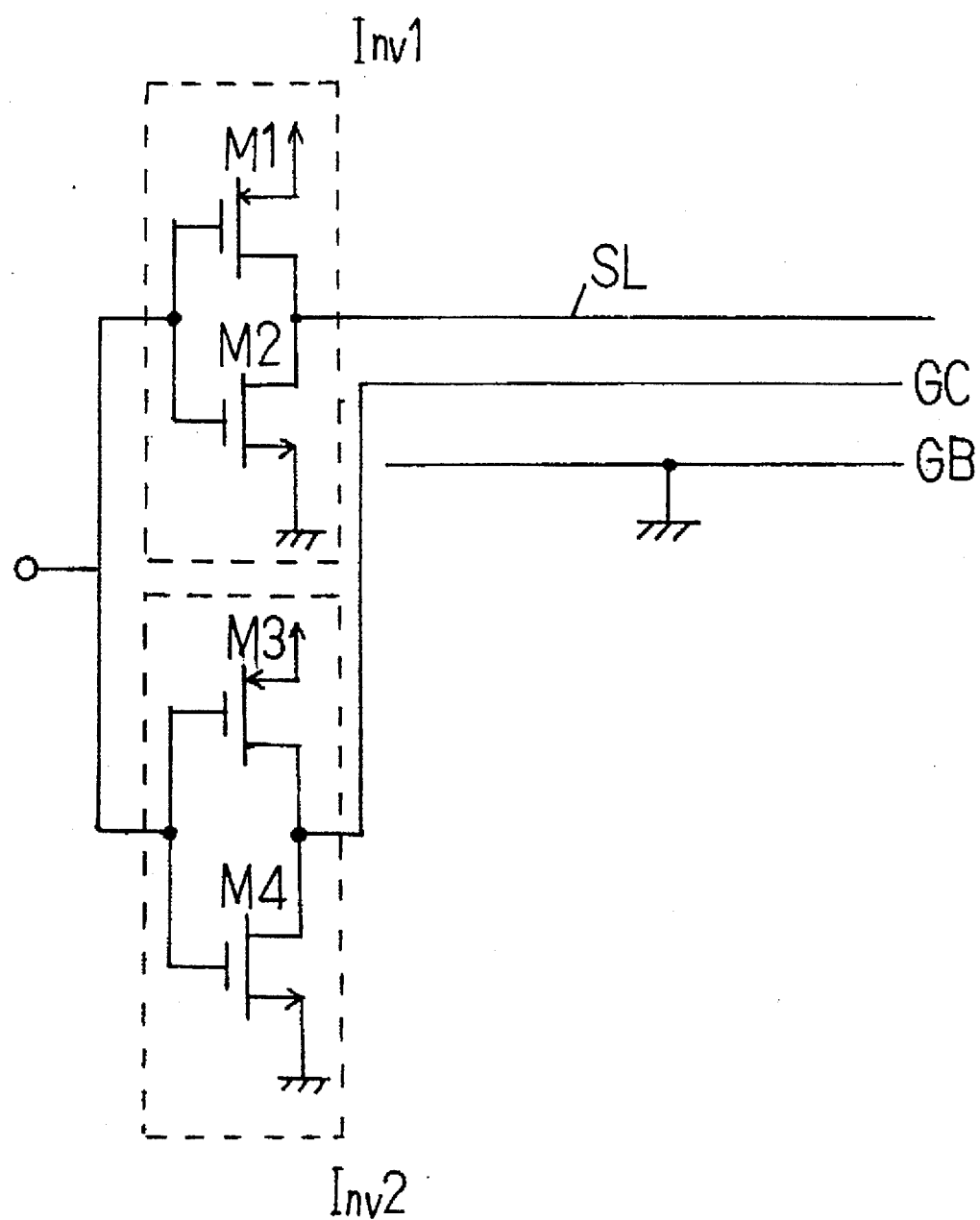
FIG. 14 is a diagram showing an embodiment according to the present invention wherein a conductor for signal and a protective conductor are driven by means of CMOS inverters.

FIG. 14 is an embodiment according to the present invention in which CMOS is used. More specifically, in this embodiment a signal conductor for signal SL and a protective conductor GC are driven by a separate CMOS inverter Inv1 and Inv2, respectively, and in this case the protective conductor GC cannot be divided. Since there are many cases wherein CMOS is operated at a comparatively low frequency, it is possible to sufficiently reduce phase lag in even this structure. A larger electrostatic capacity is connected to the protective conductor as compared to that of the signal conductor. Accordingly, good results are obtained, when larger transistors are used as the transistors M3 and M4 for the inverter Inv2 that those of transistors M1 and M2 constituting the inverter Inv1. In also this case, although the filter may be used if necessary as in FIG. 13, it is omitted for simplicity. This omission is the same as in the other embodiments in the present specification. In this embodiment, lag in the inverters is not compensated (different from the emitter follower in FIG. 7). In that case, variations in lag time of the inverters are added to those in phase of clock signal, but remarkable variations are observed in the case where chips used are different. In case of MOS, it is usual in a large system to mount the whole of, for example, one CPU on an LSI chip. As a result, variations in an inverter becomes very small. In this respect, when it is arranged in such that clock signals are distributed through the inverters and transmission lines of the same number of stages up to full load, a difference in phase of clock signal due to a difference in position of transmission line can be significantly reduced by the present invention. Hence, variations in phase of clock signals can be remarkably reduced as the whole chip. It may be expected that variations in lag time of inverter in a chip becomes smaller with the progress of manufacturing technique in the future. Therefore, the problem of variations in phase of clock signal becomes much better.

Figure 15A:
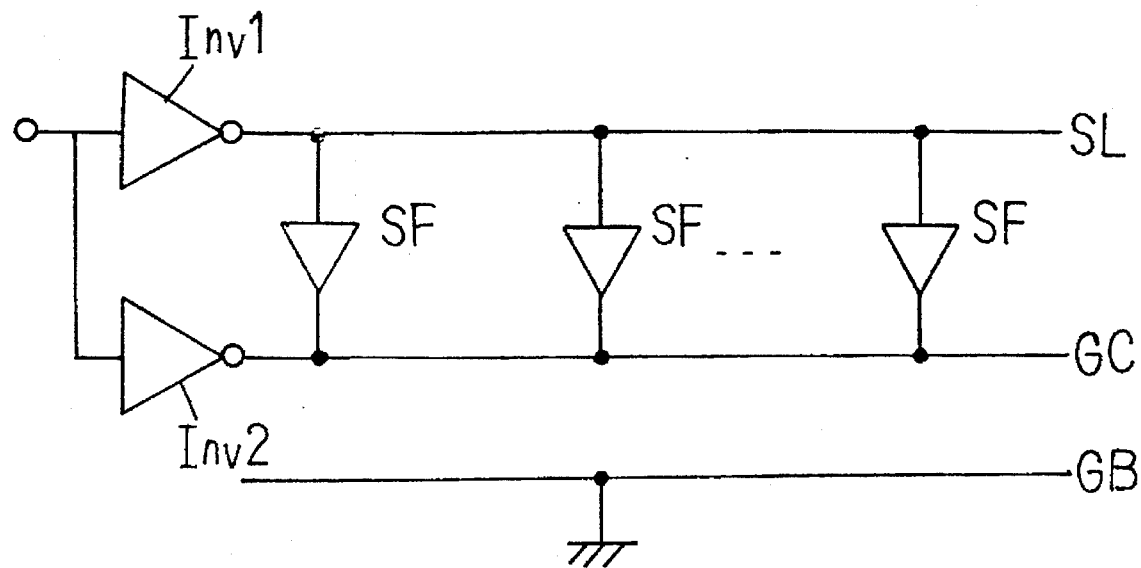
FIGS. 15(a) and 15(b) are diagrams each showing an embodiment according to the present invention wherein a protective conductor is driven with signals on a conductor for signal by employing CMOS source followers.
Figure 15B:
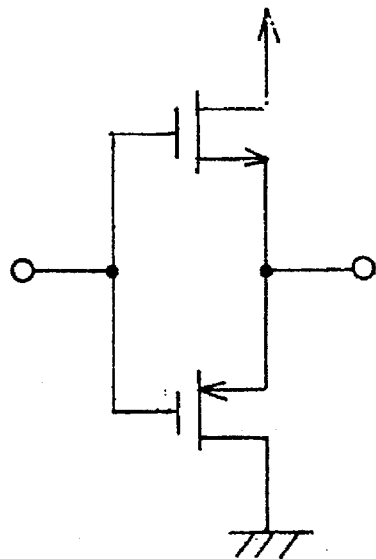

FIG. 15 shows another embodiment in which CMOS is used wherein a signal conductor SL is driven by an inverter Inv1, while a protective conductor GC is driven by an inverter Inv2 as well as by a CMOS source follower SF shown in FIG. 15(b) also, and in this case also the protective conductor GC is not divided. As a matter of course, the inverter Inv2 is not necessary in the case when the protective conductor can sufficiently be driven by only the source follower. In this case, the protective conductor may be divided, or not divided in an event where such division is not necessary. (Of course, one protective conductor may be driven by a plurality of source followers.)

Figure 16:
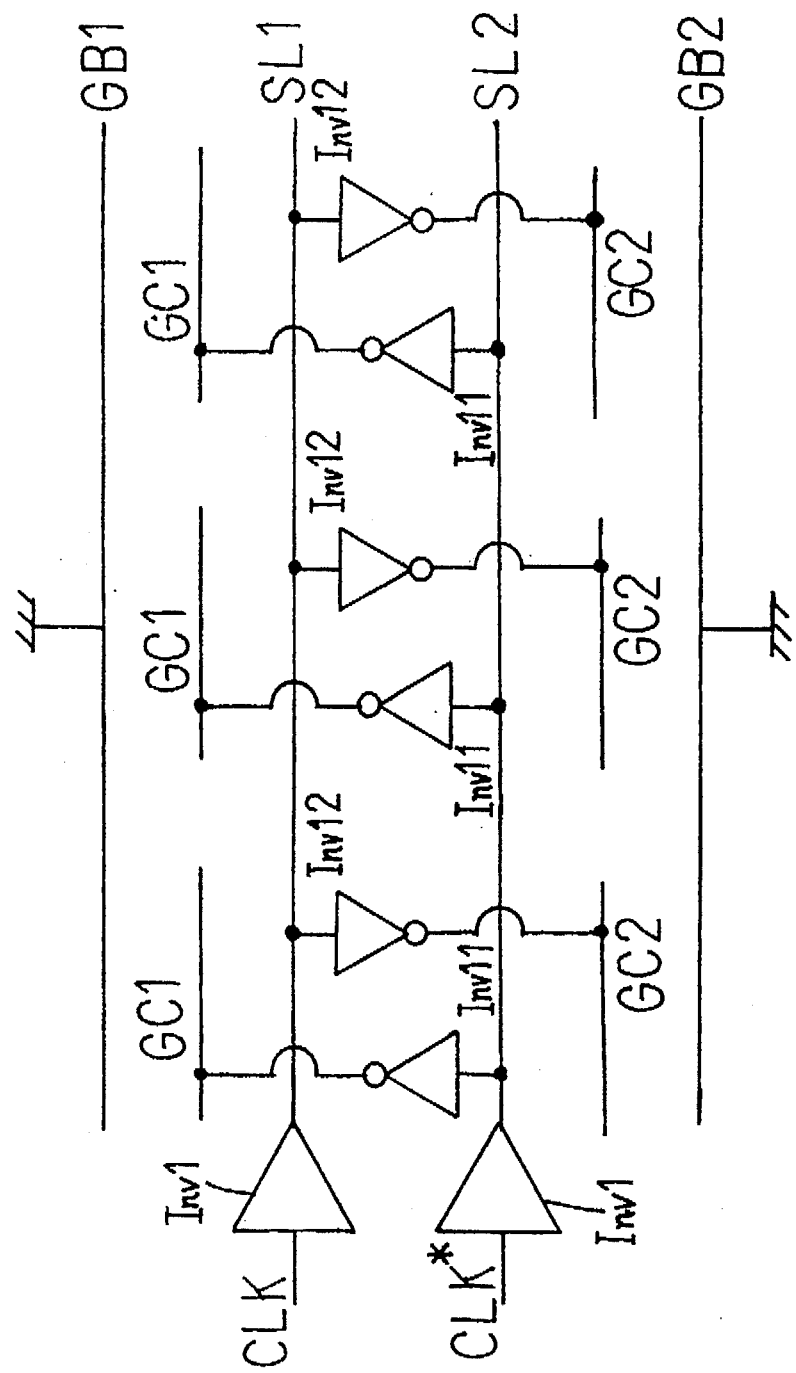
FIG. 16 is a diagram showing an embodiment according to the present invention wherein CMOS inverters suitable for a system to which are fed clock signals and their negative signals are employed.

FIG. 16 is an embodiment which can be applied to a system in which a clock signal CLK is simultaneously sent with its negative clk* (clock signal having opposite phase to that of the clock signal CLK). (In a high-speed digital system, there are many cases where both of positive-phase clock signals and its negative, negative-phase clock signals are supplied.) In FIG. 16, reference characters SL1, GC1 and GB1 denote a conductor for signal, protective conductors and a grounding body in a transmission system with respect to the signal CLK, respectively, while reference characters SL2, GC2 and GB2 designate a conductor for signal, protective conductors and a grounding body in a transmission system with respect to the signal CLK*, respectively. The conductors for signal SL1 and SL2 are driven by an inverter Inv1, respectively. On one hand, each protective conductor GC1 is driven by signals on the conductor for signal SL2 through an inverter Inv11, while each protective conductor GC2 is driven by signals on the conductor for signal SL1 through an inverter Inv12. Thus, only the inverter is used as a driving circuit so that it is suitable to realize a high-speed clock circuit by the use of CMOS. While the protective conductors GC1 and GC2 are shown in FIG. 16 as divided ones, they are operatable even if they are not divided as in the case of other embodiments. In this case, it may be arranged in such that an inverter Inv2 (not shown in FIG. 16) is added, and the protective conductors GC1 and GC2 are directly driven by the inverter Inv2 thus added, besides they are further powerfully driven by also the inverters Inv11 and Inv12, respectively. Since MOS transistor is comparatively low-speed at present, it becomes possible to effect such design that not only fundamental wave exists on a transmission line having a certain length, but also its odd-order higher harmonics as standing wave. In this case, the clock waveform becomes rectangular wave. (Of course, it is possible to design so as to send rectangular wave clock signals by lowering frequency, even if a device of much higher speed is employed.)

In the various embodiments according to the present invention described above, a position of load to be connected (Generally, it is a flip-flop, and which is typically connected to a transmission line at the final stage,) has not been mentioned. In this respect, it may be widely considered with respect to positions and manners for connecting such load. For example, load may be, of course, directly connected to a conductor for signal. In this case, it is desirable that a single load or a plurality of loads are driven through a buffer circuit such as an emitter follower in order to reduce incidental capacity to be connected to a conductor for signal as much as possible. Under other circumstances, it may be arranged in such that a load is driven from a protective conductor in accordance with the present invention. To a protective conductor is usually connected a large electrostatic capacity so that it is slightly affected, even if a load is connected thereto. In this case, the clock signals to be fed to the load are added thereto with a lag by a delay time corresponding to one state in a buffer connected across the conductor for signal and the protective conductor. However, since the full load is equivalently delayed by an amount of its one stage, variations of a phase (delay time) between the clock signals to be added to respective loads are small. Of course, a buffer may be inserted between the protective conductor and the load in order to further reduce influence of load connection.

Figure 17A:
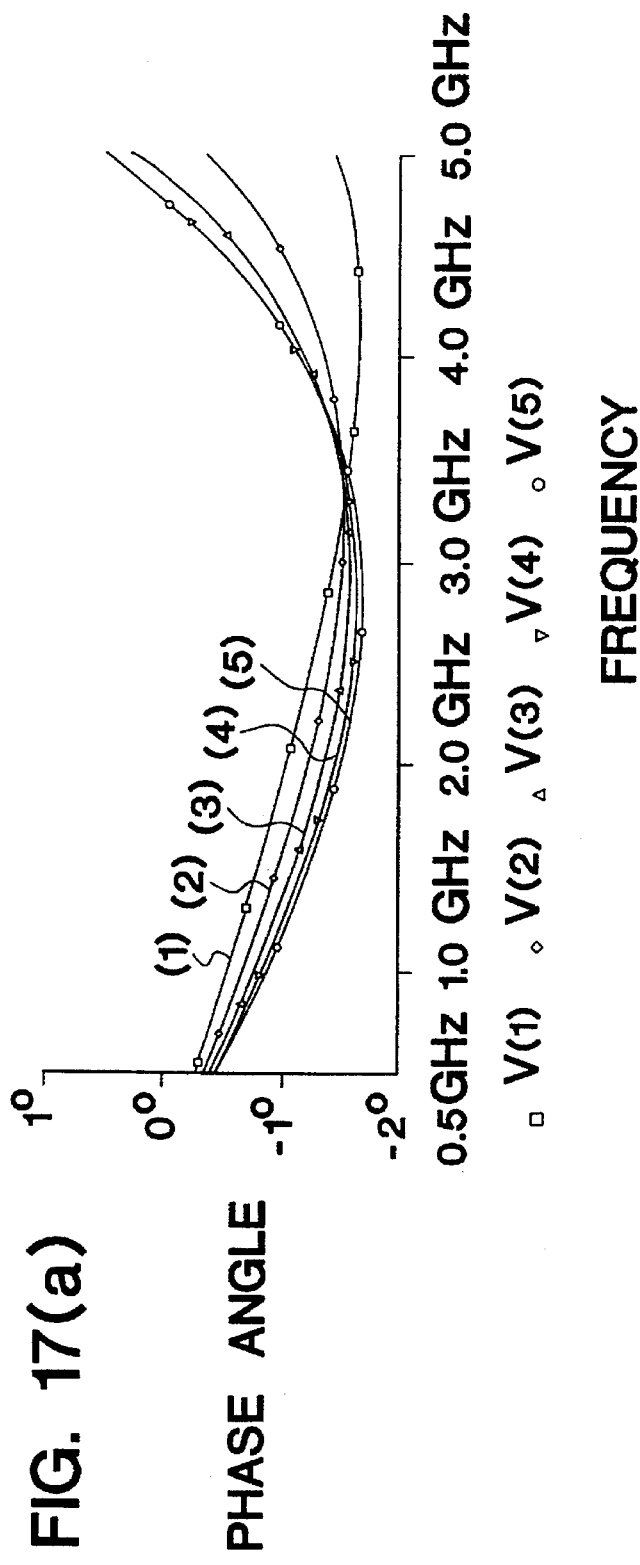
Figure 17B:
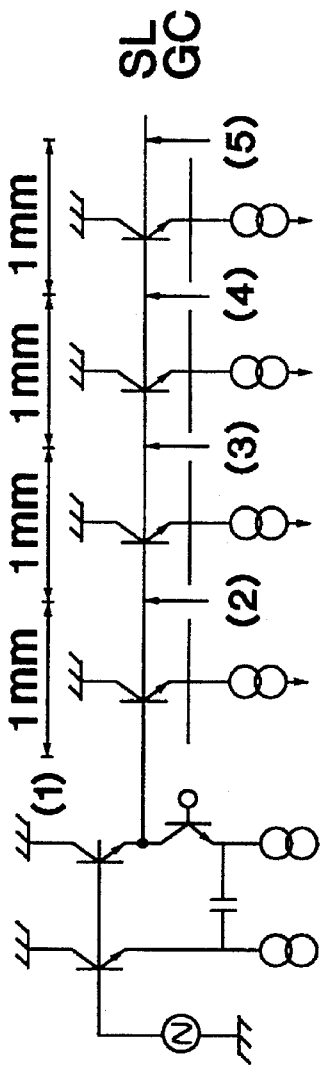

FIG. 17 shows an example which is obtained by combining the embodiments of the present invention with each other wherein FIG. 17(a) shows the results obtained by carrying out a simulation with respect to said example, and FIG. 17(b) shows a circuit diagram used for the simulation. For driving a conductor for signal SL, the circuit of FIG. 7 is employed, and further a protective conductor is driven by only an emitter follower. A transmission line simulates wiring on a silicon chip, and length of the wiring is totally 4 mm (wiring resistance~40Ω). An $f_T$ of a transistor is about 20 GHz. Moreover, it is adjusted in such that an electrostatic capacity C for canceling charge current attains the optimal results at signal frequency 5 GHz. The graph of FIG. 17(a) indicates a deviation of phase from inputting signals at positions (1) through (5) on a conductor for signal. (More specifically, when a phase angle is −360 degrees, it means a lag in one cycle.) Judging from the results at frequency 5 GHz, the deviation is within a range of ± two degrees. At 5 GHz, one cycle is 200 p seconds, while one degree corresponds to about 0.5 p second, so that the fact to the effect that the deviations within a range of two degrees means that delay in signal is within a range of 1 p second. This fact means that variations in delay time of signal are improved by 1 to 2 digits as compared with the case where the present invention is not applied. In case of MOS circuit, since transistor is not high-speed as in case of bipolar-MOS, effects are not so attained as in the case of FIG. 17. However, according to simulation results (not shown), the deviation is improved several times better or by one digit. These values are the ones attained by employing transistors available at present, and hence it is apparent that better results will be obtained when characteristics of transistor are improved in future.

Furthermore, while it is not specifically mentioned as to an embodiment in which GaAs and FET are used, essentially the same circuit with that in which bipolar transistor is used may be employed.

Figure 1:
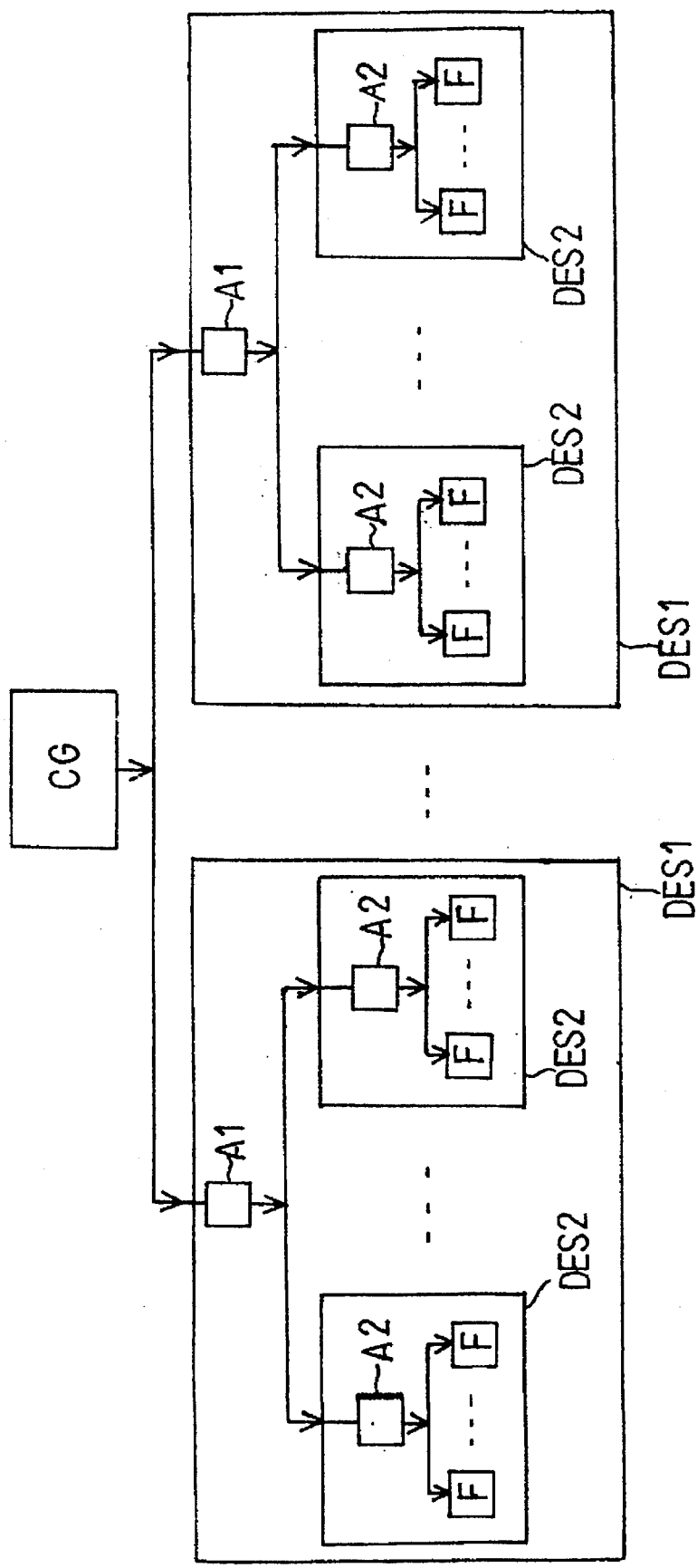
FIG. 1 is a block diagram showing a conventional clock signal distribution system.
Figure 2A:
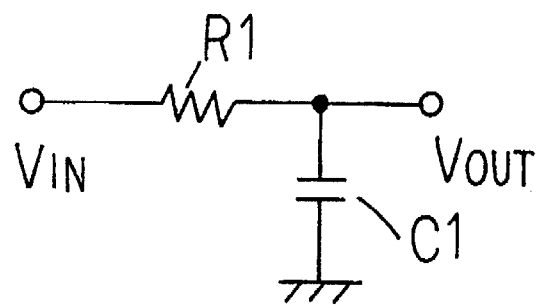
Figure 2B:
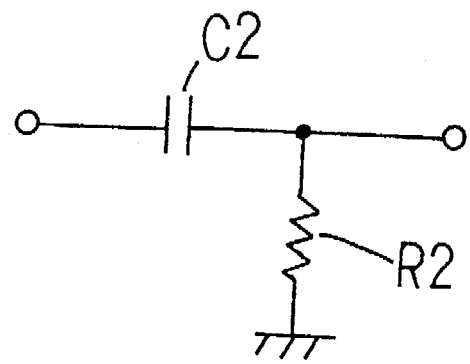
Figure 18:
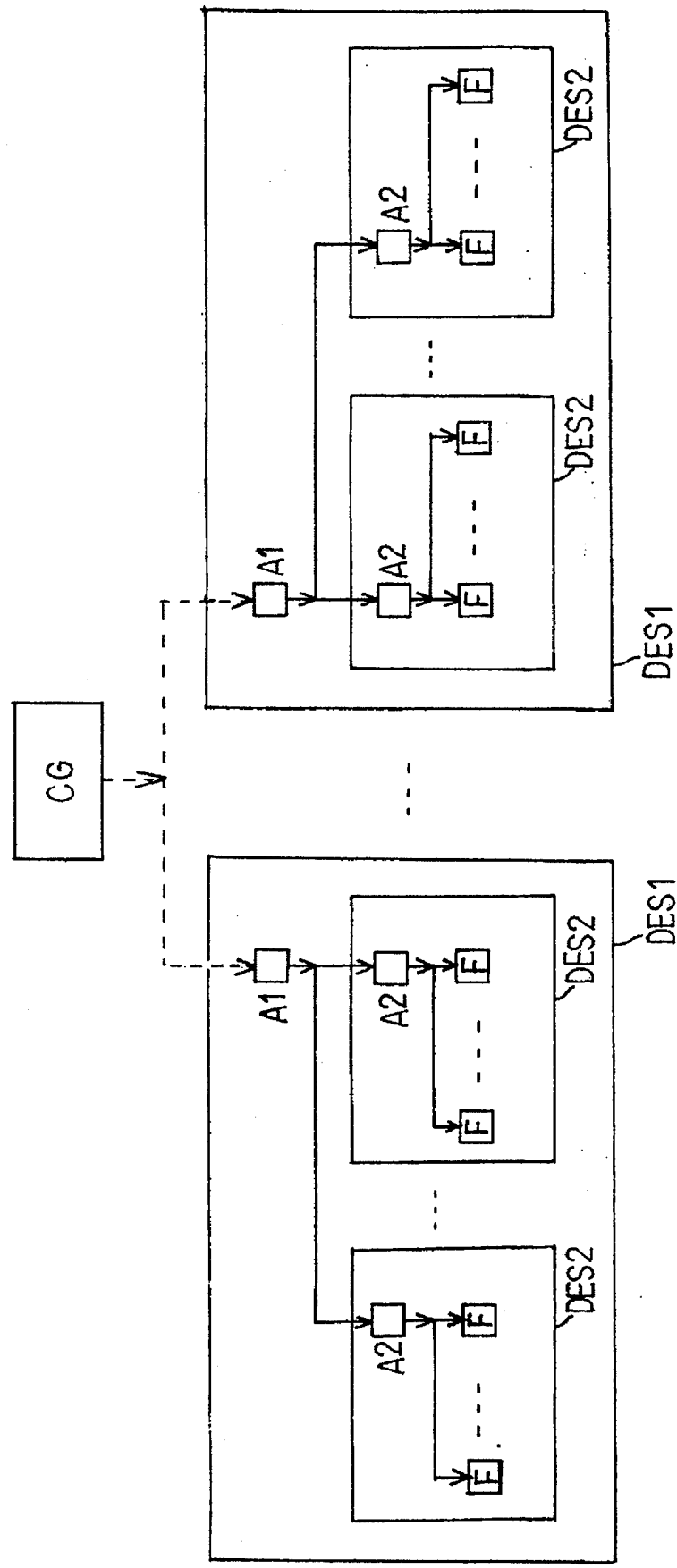
FIG. 18 is a block diagram showing an embodiment of the digital system the whole or substantially whole of which is constituted by the clock signal distributing system according to the present invention.

FIG. 18 is a schematic diagram showing an embodiment of a system to the whole or substantially whole of which is applied the present invention. An object of the present invention is to feed clock signals as standing wave to the whole or substantially whole the system. In FIG. 18, reference character CG designates a clock signal generating circuit, DES1 modules on which are mounted a plurality of, for example, integrated circuit chips, A1 buffer amplifiers, DES2 integrated circuit chips, A2 buffer amplifiers, and F flip-flops in chips, respectively. As a matter of course, as mentioned with reference to FIG. 1, these hierarchical clock signal distributing system may be the one which is different from that mentioned just above. For example, DES2 may be a module. In FIG. 18, a clock signal line shown by a solid line, e.g. the solid line extending from the buffer A1 to the buffer A2 indicates an electromagnetic transmission path according to the present invention. One hand, a signal path, for example, extending from CG to A1 is shown by a broken line, and this line indicates clock signal distributing line which is, for example, comparatively longer than wavelength of clock signal. In this case, it is also possible to send clock signals in standing wave through also a signal path portion indicated by a dotted line as electromagnetic transmission path. In that case, when signals are sent in an ordinary transmission path without according to the present invention, a means for receiving signals, for example, the buffer A1 must be arranged to receive the signals in the vicinity of loop portion of standing wave. On the contrary, in the case according to the present invention, wavelength of clock signal becomes longer by about one digit, so that even if the transmission path is comparatively long, it is within a range of (1/10) wavelength or less. Furthermore, with respect to a much longer transmission line, it is sufficient to insert a buffer having a small phase difference according to the present invention at halfway of the transmission line. On the other hand, it may be arranged in such that clock signals are sent in the form of usual progressive wave, but not standing wave with respect to the portion which is now discussed, and phase adjustment is effected in accordance with prior art.

While the above description has been made on the examples wherein periodic clock signals are fed, many circuits of the present invention may, of course, be employed also for ordinary transmission of pulse shape, and in such a case effects are not expected as in case of periodic wave, but delay due to RC can be moderated.

As mentioned above, according to the present invention, a phase lag in transmission of clock signals and a phase lag in amplifier are compensated by utilizing periodicity of clock signals, and at the same time a phase velocity is accelerated to lengthen wavelength of clock signal, besides a phase lag due to loss derived from series resistance in transmission path is also compensated in a clock signal distributing system in which clock signals are fed as standing wave. From these respective elements, it is expected that a deviation in phase is improved to be several times smaller as compared with that of prior art. Thus, when these respective elements are combined for use, a deviation in phase is totally improved easily to be ten times or more smaller than that of prior art.

It will be appreciated by those of ordinary skill in the art that the present invention can be embodied in other specific forms without departing from the spirit or essential characteristics thereof.

The presently disclosed embodiments are therefore considered in all respect to be illustrative and not restrictive. The scope of the invention is indicated by the appended claims rather than the foregoing description, and all changes that come within the meaning and range of equivalents thereof are intended to be embraced therein.

What is claimed is:

1. A clock signal distributing system comprising an electromagnetic transmission path line through which periodic clock signals are transmitted as a standing wave, an amplifying element, and a phase advancing means for advancing phases of said periodic clock signals, a transmission phase lag and/or an amplification phase lag in said clock signals being corrected in a direction of the phase advancement by means of said phase advancing means, a grounding body and a protective conductor disposed between said electromagnetic transmission path line and said grounding body, wherein said phase advancing means is composed of a negative resistance circuit which is connected across said electromagnetic transmission path line and said grounding body or said protective conductor, and affords an equivalent negative resistance to said electromagnetic transmission path line, whereby a deviation in phases of said clock signal standing wave which occurs due to a resistance loss of said electromagnetic transmission path line is corrected.

2. A clock signal distributing system comprising an electromagnetic transmission path line through which periodic clock signals are transmitted as a standing wave, an amplifying element, and a phase advancing means for advancing phases of said periodic clock signals, a transmission phase lag and/or an amplification phase lag in said clock signals being corrected in a direction of the phase advancement by means of said phase advancing means, wherein said phase advancing means comprises a circuit for supplying a current which cancels charge and discharge currents with respect to an electrostatic capacity load of said amplifying element, and a negative feedback amplifying circuit which detects and amplifies a difference between the input and output voltage from said amplifying element to reduce the difference between said input and output voltages by means of negative feedback by outputting said difference to said electromagnetic transmission path line upstream from said amplifying element.

3. A clock signal distributing system comprising an electromagnetic transmission path line through which periodic clock signals are transmitted as a standing wave, an amplifying element, and a phase advancing means for advancing phases of said periodic clock signals, a transmission phase lag and/or an amplification phase lag in said clock signals being corrected in a direction of the phase advancement by means of said phase advancing means, wherein said phase advancing means constitutes a circuit for adding an equivalent negative electrostatic capacity at a position between said electromagnetic transmission path line and a grounding body, whereby a phase velocity of clock signals on the path line is accelerated to lengthen a wavelength of clock signals.

4. A clock signal distributing system as claimed in claim 3 wherein said negative electrostatic capacity adding circuit includes a protective conductor disposed between said electromagnetic transmission path line and said grounding body, whereby an output of said amplifying element is connected to said protective conductor.

5. A clock signal distributing system as claimed in claims 2 or 3 further comprising a grounding body and a protective conductor disposed between said electromagnetic transmission path line and said grounding body, wherein said phase advancing means further includes a negative resistance circuit which is connected across said electromagnetic transmission path line and said grounding body or said protective conductor, and affords an equivalent negative resistance to said electromagnetic transmission path line, whereby a deviation in phases of said clock signal standing wave which occurs due to a resistance loss of said electromagnetic transmission path line is corrected.

6. A clock signal distributing system as claimed in claim 4 wherein said phase advancing means further includes a negative resistance circuit which is connected across said electromagnetic transmission path line and said grounding body or said protective conductor, and affords an equivalent negative resistance to said electromagnetic transmission path line, whereby a deviation in phases of said clock signal standing wave which occurs due to a resistance loss of said electromagnetic transmission path line is corrected.

7. A clock distributing system as claimed in claims 2 or 3 further comprising a grounding body and a protective conductor disposed between said electromagnetic transmission path line and said grounding body, a filter circuit connected along at least one of said electromagnetic transmission path line and said protective conductor, and wherein a length of said electromagnetic transmission path line is arranged so as to attenuate oscillation of a frequency corresponding to ¼ wavelength or more.

8. A clock signal distributing system as claimed in claim 4 further comprising at least one filter circuit connected along at least one of said electromagnetic transmission path line and said protective conductor, and wherein a length of said electromagnetic transmission path line is arranged so as to attenuate oscillation of a frequency corresponding to ¼ wavelength or more.

9. A clock signal distributing system as claimed in claim 1 further comprising at least one filter circuit connected along at least one of said electromagnetic transmission path line and said protective conductor, and wherein a length of said electromagnetic transmission path line is arranged so as to attenuate oscillation of a frequency corresponding to ¼ wavelength or more.

10. A clock signal distributing system comprising;
a first transmission system for positive phase clock signals including,
  a first electromagnetic transmission path line, receiving a first input signal, through which said positive phase clock signals are transmitted as a first standing wave,
  a first inverter receiving said first standing wave and outputting a first inverted standing wave having a phase opposite to a phase of said first standing wave, and
  a first protective conductor receiving said first inverted standing wave; and
a second transmission system for negative phase clock signals including,
  a second electromagnetic transmission path line, receiving a second input signal, through which said negative phase clock signals are transmitted as a second standing wave,
  a second inverter receiving said second standing wave and outputting a second inverted standing wave having a phase opposite to a phase of said second standing wave, and
  a second protective conductor receiving said second inverted standing wave.

11. A clock signal distributing system as claimed in claim 10, wherein each of said first and second transmission systems further includes a phase advancing means for advancing phases of said clock signals, a transmission phase lag and/or an inversion phase lag being corrected in a direction of phase advancement by said phase advancing means.

12. A clock signal distributing system as claim in claim 11 wherein each of said phase advancing means comprises a circuit for supplying a current which cancels charge and discharge currents with respect to an electrostatic capacity load of a corresponding inverter of said first and second inverters, and a negative feedback amplifying circuit which detects and amplifies a difference between the input and output voltages from said corresponding inverter to reduce the difference between said input and output voltages by means of negative feedback by outputting said difference to a corresponding electromagnetic transmission path line of said first and second electromagnetic transmission path lines upstream of said corresponding inverter.

13. A clock signal distributing system as claimed in claim 11, wherein each of said phase advancing means constitutes a circuit for adding an equivalent negative electrostatic capacity at a position between a corresponding electromagnetic transmission path line of said first and second electromagnetic transmission path lines and a corresponding grounding body of a first and a second grounding body, whereby a phase velocity of clock signals on said corresponding electromagnetic transmission path line is accelerated to lengthen a wavelength of clock signals.

14. A clock signal distributing system as claimed in claim 11, further comprising a first grounding body, said first protective conductor being disposed between said first electromagnetic transmission path line and said first grounding body, and a second grounding body, said second protective conductor being disposed between said second electromagnetic transmission path line and said second grounding body, wherein each of said phase advancing means is composed of a negative resistance circuit which is connected across a corresponding electromagnetic transmission path line and a corresponding grounding body or protective conductor, and affords an equivalent negative resistance to said corresponding electromagnetic transmission path line, whereby a deviation in phases of said clock signal standing wave which occurs due to a resistance loss of said corresponding electromagnetic transmission path line is corrected.

15. A clock signal distributing system as claimed in claim 13 wherein each of said phase advancing means further includes a negative resistance circuit which is connected across said corresponding electromagnetic transmission path line and said corresponding grounding body or a corresponding protective conductor of said first and second protective conductors, and affords an equivalent negative resistance to said corresponding electromagnetic transmission path line, whereby a deviation in phase of a corresponding standing wave of said first and second standing waves which occurs due to a resistance loss of said corresponding electromagnetic transmission path line is corrected.

16. A clock distributing system as claimed in claim 10, wherein each of said first and second transmission systems further include a filter circuit connected along at least one of a corresponding electromagnetic transmission path line and a corresponding protective conductor, and wherein a length of said corresponding electromagnetic transmission path line is arranged so as to attenuate oscillation of a frequency corresponding to ¼ wavelength or more.

17. A clock signal distributing system as claimed in claim 4 wherein said amplifying element drives said protective conductor with approximately the same waveform as that of said clock signal, wherein effective capacitance between said electromagnetic transmission path line and said protective conductor is significantly reduced, thereby said clock signal is transmitted as a nearly perfect standing wave with a very small phase shift along said electromagnetic transmission path line.

18. A clock signal distributing system comprising an electromagnetic transmission path line through which periodic clock signals are transmitted as a standing wave, an amplifying element, and a phase advancing means for advancing phases of said periodic clock signals, a transmission phase lag and/or an amplification phase lag in said clock signals being corrected in a direction of the phase advancement by means of said phase advancing means, a grounding body and a protective conductor disposed between said electromagnetic transmission path line and said grounding body, a filter circuit connected along at least one of said electromagnetic transmission path line and said protective conductor, and wherein a length of said electromagnetic transmission path line is arranged so as to attenuate oscillation of a frequency corresponding to ¼ wavelength or more.

* * * * *